United States Patent [19]

Bársony

[11] Patent Number: 4,920,400
[45] Date of Patent: Apr. 24, 1990

[54] SEMICONDUCTOR DEVICE

[75] Inventor: Istyán Bársony, Budapest, Hungary

[73] Assignees: Research Development Corporation of Japan, Tokyo, Japan; Barsony Istvan, Istenhegyi, Hungary

[21] Appl. No.: 298,841

[22] Filed: Jan. 18, 1989

Related U.S. Application Data

[63] Continuation of Ser. No. 925,368, Oct. 30, 1986, abandoned.

[30] Foreign Application Priority Data

Nov. 1, 1985 [JP] Japan .................. 60-244091

[51] Int. Cl.$^5$ .................. H01L 29/12; H01L 29/00; H01L 27/02
[52] U.S. Cl. .................. 357/58; 357/7; 357/44
[58] Field of Search .................. 357/58, 7, 44

[56] References Cited

U.S. PATENT DOCUMENTS

3,840,888  10/1974  Gaenssler et al. .............. 357/42
4,182,965   1/1980  Pfleiderer ...................... 357/58

*Primary Examiner*—Rolf Hille
*Assistant Examiner*—Robert P. Limanek
*Attorney, Agent, or Firm*—Darby & Darby

[57] ABSTRACT

A semiconductor device comprising a pair of p-type regions facing each other, a pair of n-type regions facing each other, and a nearly intrinsic region connecting these regions, thereby establishing a hole current path connecting the p-type regions and an electron current path connecting the n-type regions. Each of the hole current path and the electron current path has a transfer function which is a function of structural parameters of the device and the applied biases. The electron current path and the hole current path can provide a complementary pair of outputs.

5 Claims, 6 Drawing Sheets

SEMICONDUCTOR DEVICE

This is a continuation, of application Ser. No. 925,368, filed Oct. 30, 1986 abandoned.

BACKGROUND OF THE INVENTION

1. Field of the Invention

This invention relates to a semiconductor device and more particularly to a novel semiconductor device capable of allowing flow of an electron current and a hole current in different direction.

2. Description of the Related Art

Various semiconductor devices have been proposed heretofore. There are those having one-dimensional structures by which an output is provided according to one transfer function $f_1 (V_1, V_2, \ldots)$ or $f_2 (I_1, I_2, \ldots)$, where $V_1, V_2, \ldots$ are input voltages and $I_1, I_2, \ldots$ are input currents, such as bipolar junction transistors, field effect transistors, thyristors, etc. There are also those having two-dimensional structures in which a potential barrier $\Psi (V_1, V_2)$ is formed in response to input voltages $(V_1, V_2)$ and an output is provided according to one transfer function $f_3 (\Psi)$ in accordance with the potential barrier $\Psi$. Here, the word "two-dimensional" is used to mean the positive role of the gate and drain voltages for electrostatically controlling a potential barrier (saddle point) in the current path through different directions.

As described above, the conventional semiconductor devices have one transfer function irrespective of whether they have a one-dimensional or two-dimensional structure. The semiconductor device having only one transfer function has its own advantages and disadvantages. There is a need for a novel semiconductor device which is free from the limitations of the conventional semiconductor devices. For example, the conventional semiconductor devices have some structural limitation for raising the packing density, and there is a demand for a new device having a completely novel structure which can break through the limitation in the packing density.

SUMMARY OF THE INVENTION

An object of this invention is to provide a semiconductor device having two transfer functions.

Another object of this invention is to provide a semiconductor device capable of producing two different outputs determined by two transfer functions $F(\Psi)$ and $g(\Psi)$ which are dominated by one potential barrier structure $\Psi(V_1, V_2, \ldots)$ established in response to voltage inputs $V_1, V_2, \ldots$. The potential barrier may have three-dimensional features. The response functions $f(\Psi)$ and $g(\Psi)$ can be correlated through a relation $f(\Psi)=h(g(\Psi))$. The response function is dependent on various structure parameters such as the temperature $T_1$ impurity concentration, dimensions of the respective regions in the device, and bandgap of the semiconductor.

BRIEF DESCRIPTION OF THE DRAWINGS

FIGS. 6A and 6B show in perspective view semiconductor devices of circular coordinate structure according to embodiments of the present invention; wherein FIG. 6A shows a planar structure and FIG. 6B shows a cut-away structure.

FIGS. 7A and 7B show in perspective view semiconductor devices of Cartesian coordinate structure according to embodiments of the present invention; wherein FIG. 7A shows a planar structure and FIG. 7B shows a cut-away structure.

DESCRIPTION OF THE PREFERRED EMBODIMENTS

Firstly, the concept of the present invention will be described referring to a simplified structure of the present invention.

Figure 1:
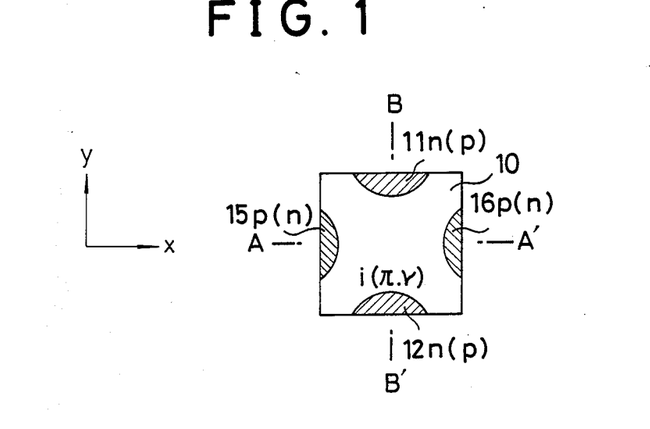
FIG. 1 shows an electrode configuration of a semiconductor device according to an embodiment of the present invention.

FIG. 1 shows a cross-section of a semiconductor device in xy-plane. There is no structural change in z-direction. In a semiconductor body 10 of an intrinsic or nearly intrinsic conductivity i (or $\lambda$ or $\nu$), a pair of n-type regions 11 and 12 and a pair of p-type regions 15 and 16 are formed to oppose each other. In the figure, the direction which connects the n-type regions 11 and 12 is substantially perpendicular to the direction which connects the p-type regions 15 and 16. There are established two possible current paths: a hole current path 15-10-16 and an electron current path 11-10-12. Both the current paths utilize the substantially intrinsic region 10 as an active region for controlling the current flow.

Figure 2A:
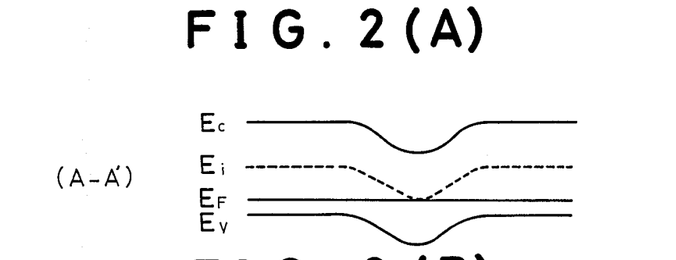
FIGS. 2A and 2B are energy band diagrams in the semiconductor device of FIG. 1 along the lines A-A' and B-B' shown in FIG. 1 respectively.

FIG. 2A shows an energy band diagram in the semiconductor device of FIG. 1 along the line A—A' in FIG. 1 which is also designated as x-axis. In the figure, symbol $E_c$ denotes the bottom of the conduction band, $E_i$ the intrinsic or mid-gap level, $E_F$ the Fermi level, and $E_V$ the top of the valence band. It is assumed that the device is applied with no bias voltage and is in a thermally equilibrium state. The proximity of the valence band to the Fermi level at both sides denotes that these regions are p-type regions. The top of the valence band, i.e. the $E_V$ level, forms a downward hump at the middle portion corresponding to the middle portion of the i-region 10. This hump represents a potential barrier for the positive holes in the valence band. It is to be noted that the $E_V$ level is further lowered as it departs from the line A—A', as will be described in connection with FIG. 2B.

Figure 2B:
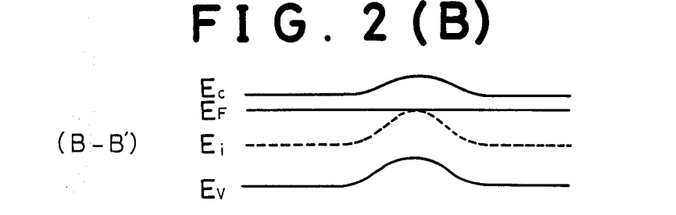

FIG. 2B shows the energy band diagram in the device of FIG. 1 along the line B—B' which is also designated as y axis. The proximity of the Fermi level $E_F$ to the bottom of the conduction band $E_c$ at both sides denotes that these regions are of n type. The upward hump in the $E_c$ level in the middle portion represents a potential barrier for electrons. Similar upward hump in the $E_V$ level represents a potential well for positive holes. It is recalled that the $E_V$ level in FIG. 2A has a downward hump at the middle portion. The upward hump in the $E_V$ level in FIG. 2B then shows that the potential level for holes forms a saddle point structure at the middle portion. Similarly, the potential level for electrons forms a saddle point structure at the middle portion. In other words, holes in the p-type region 15 may be transferred to the other p-type region 16 across a potential barrier in the i-type region 10, and electrons in the n-type region 11 may be transferred to the other n-type region 12 across a potential barrier in the i-type region 10. That is, a pair of substantially perpendicular current paths are formed in the semiconductor body.

Figure 3:
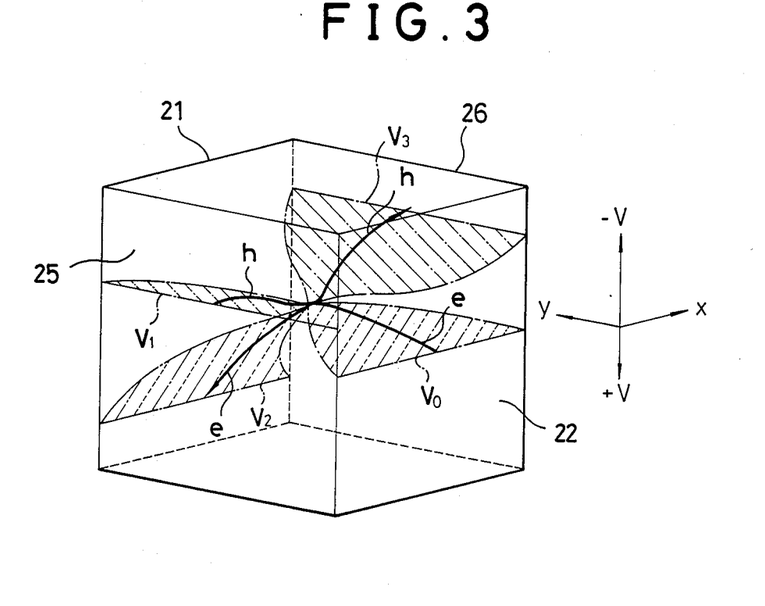
FIG. 3 shows schematically a potential distribution for holes and electrons in a semiconductor device of FIG. 1.

FIG. 3 illustrates the potential distribution in such current paths in the semiconductor device of FIG. 1. In the figure, it is assumed that the p-type regions 15 and 16 are formed in the faces 25 and 26, that the n-type regions 11 and 12 are provided in the faces 21 and 22, and that the vertical direction in the figure represents the potential for electrons.

Now, it is assumed that the p-type region 16 is applied with a negative bias with respect to the p-type region 15 and that the n-type region 11 is applied with a positive bias with respect to the n-type region 12. Hence, holes in the p-type region 15 tend to go into the p-type region 16 and electrons in the n-type region 12 tend to go into the n-type region 11.

The semiconductor device according to this invention basically performs three-dimensional operation in which a single potential barrier structure works on both the positive holes and the electrons in the semiconductor.

When a channel for one type of carriers is being pinched off, a punch-through current in the other channel for the other type of carriers increases. Thus, a pair of complementary information outputs are provided.

Since the hole and the electron currents are controlled by a potential barrier which is dependent on the bandgap, each of the two output currents has a negative temperature coefficient. Each of the complementary channels allows flow of a current similar to a static induction transistor depending on the respective terminal voltages. Namely, the current is non-saturated and a high transconductance is provided.

In the actual devices, deviations from the exponential rule occur in the high current region by the series resistance effect. See U.S. Pat. Nos. 3,828,230 and 4,199,771 which are incorporated herein by reference.

This device can be operated with all the pn junctions being grounded or reverse-biased.

There can be established two current paths; a p channel for allowing flow of a current mainly formed of positive holes and an n channel for allowing flow of a current mainly formed of electrons. There may be established a common barrier region through which the two channels penetrate. Either polarity of majority carriers can flow across the potential barrier. Once carriers pass over the potential barrier, they flow in a drift field.

As seen in FIG. 3, the currents in the two channels may cross perpendicularly at the saddle point of the potential profile, which is determined by the device parameters and the bias conditions. At this cross point (more strictly the region where the two currents cross each other), a plasma may be produced with holes and electrons. But such plasma region can be made very narrow and electric drift fields can be set up adjacent to such a plasma region. Thus, the carrier transport can be substantially of high field type and the carrier velocity can be very high (with limitations by the saturation velocity and collisions dependent on the lattice temperature). In total, recombination of carriers can be made negligible.

FIGS. 4A, 4B, 5A and 5B illustrate potential distributions in the device of FIG. 1. It is assumed that the n-type regions 11 and 12 have respective potentials $V_0$ and $V_2$ and that the p-type regions 15 and 16 have respective potentials $V_1$ and $V_3$.

Figure 4A:
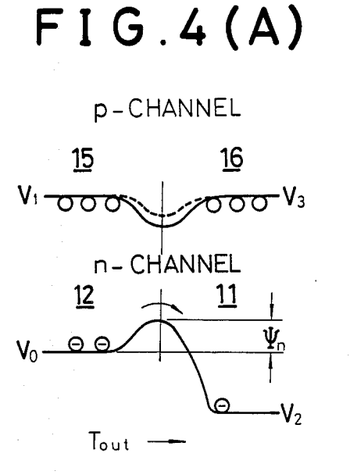
FIGS. 4A and 4B are energy band diagrams in the semiconductor device of FIG. 1 when a pair of p-type or n-type regions are connected to each other.
Figure 4B:
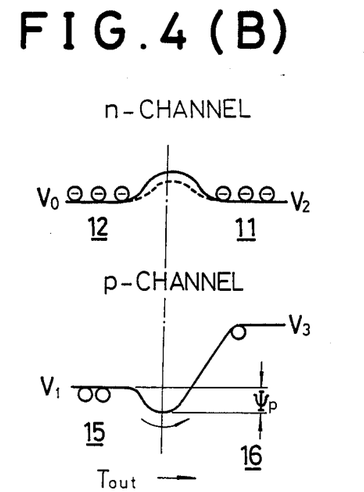

FIGS. 4A and 4B illustrate the cases where either one pair of the n-type regions and 12 or the p-type regions 15 and 16 are grounded to the earth potential ($V_0=V_2=0$ or $V_1=V_3=0$).

FIG. 4A shows a case where the two p-type regions 15 and 16 are grounded or at a same potential ($V_1=V_3$). Here, since the regions 15 and 16 are equi-potential, no current will flow therebetween. There is also established a built-in voltage between the p-type regions 15 and 16 and the i-type region 10 which acts to establish a potential barrier for positive holes in a middle portion. A portion where a potential barrier is formed for positive holes acts as a potential well or valley for electrons. Thus, in a line connecting the p-type regions 15 and 16, the middle portion has the lowest potential level for electrons. In the direction connecting the n-type regions 11 and 12, the potential level for electrons is as shown in the lower part of FIG. 4A. While the n-type region 12 is kept at a potential $V_0$, the other n-type region 11 is applied with a more positive voltage $V_2$ which acts to lower the height $\Psi_n$ of the potential barrier for electrons. When electrons in the n-type region 12 gain a sufficient energy to exceed the potential barrier $\Psi_n$, they can go over the potential barrier to the more positively biased region 11. Here, it may be recalled that the potential level for holes becomes higher as it departs from the center in the direction connecting the regions 15 and 16. Namely, the potential distribution forms a saddle-point structure. The height of the potential barrier $\Psi_n$ is controllable by the biases $V_1(=V_3)$ and $V_2$ with respect to the reference potential $V_0$. This is similar to the static induction transistor (SIT), see U.S. Pat. Nos. 4,284,997, 4,337,473, 4,364,072, 4,199,771, 4,334,235, 4,317,127 4,198,645, 4,297,718 and 3,828,230 which are hereby incorporated by reference.

FIG. 4B shows a case where the pair of n-type regions 11 and 12 are kept at the same potential $V_0=V_2$ and a p-type region 16 is applied with a more negative potential with respect to the other p-type region 15. Positive holes in the p-type region 15 can go into the other p-type region 16 when they gain a sufficient energy to go over the potential barrier $\Psi_p$.

In the operation modes shown in FIGS. 4A and 4B, the semiconductor device acts as an n-channel or a p-channel SIT. When the bias conditions are changed from those of FIG. 4A to those of FIG. 4B, the semiconductor device will change its operation mode from an n-channel SIT to a p-channel SIT.

Figure 5A:
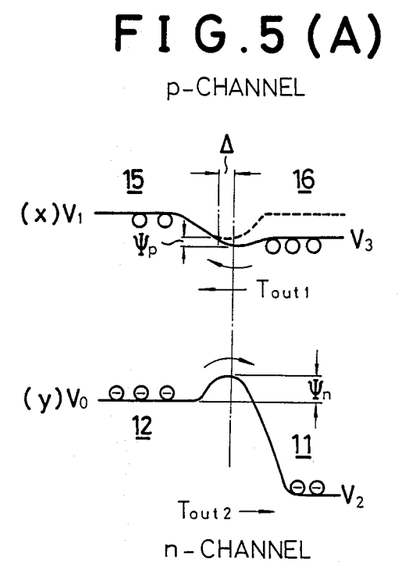
FIGS. 5A and 5B are energy band diagrams in the semiconductor device of FIG. 1 when one p-type region and one n-type region are grounded.
Figure 5B:
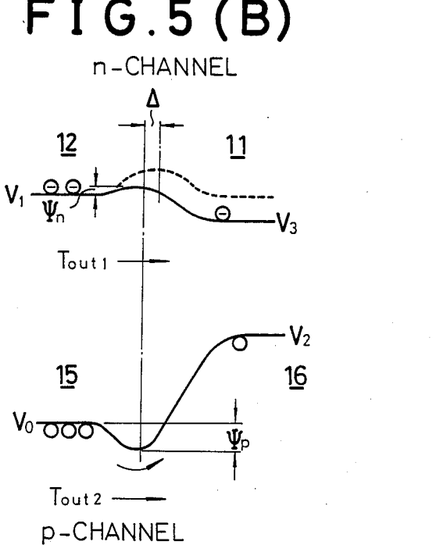

FIGS. 5A and 5B show the cases where one of the p-type regions 15 and 16 and the one of n-type regions 11 and 12 are each grounded or kept at a constant bias and the others are each variably biased.

FIG. 5A shows a case where the p-type region 16 and 16 biased to work as a kind of gate region and the n-type regions 11 and 12 are biased to work as a drain and a source. The potential barriers for the holes and the electrons in the central region 10 are determined by the dimensions and the impurity concentrations of the respective regions and by the applied thereto. Referring to the upper part of FIG. 5A, when the p-type region 16 is biased forwardly, i.e. more positive with respect to the other p-type region 15, positive holes in the p-type region 16 can flow into the other p-type region 15. Then based on an SIT model, a gate-to-gate current flows in addition to the source-to-drain current.

FIG. 5B shows another case where the two p-type regions 15 and 16 can be considered as a source and a drain and the n type regions 11 and 12 can be considered as a pair of gate regions, establishing a p-channel SIT. Here also, a gate-to-gate current can flow depending on the bias $V_3$ of the region 11 and other conditions, ion addition to the source-to-drain current.

When the pair of gate regions are biased differently, a saddle point of the potential distribution shifts a distance $\Delta$ from the center of the channel region.

Generally, when there are provided a pair of n-type electrodes and a pair of p-type electrodes opposing to each other through a nearly intrinsic region, two types of current, i.e. electron current and hole current, $I_n$ and $I_p$ can be caused to flow.

$$I_n = f(\Psi_n) \quad (1),$$

$$I_p = g(\Psi_p) \quad (2),$$
where $$\Psi_n = \Phi_1 (V_p, V_n, T, \text{structural parameters}) \quad (3),$$

$$\Psi_p = \Phi_2 (V_p, V_n, T, \text{structural parameters}) \quad (4),$$

and $I_n$ denotes an n-channel current, $I_p$ a p-channel current, $\Psi_n$ a potential barrier for electrons, $\Psi_p$ a potential barrier for holes, $V_p$ potentials of the p-type regions, $V_n$ potentials of the n-type regions and T the absolute temperature of the device. Each current $I_n$ or $I_p$ behaves analogously to a channel current in an n-channel or p-channel SIT. A difference may be found in the position of the potential barrier of saddle shape for the electrons and the holes, as mentioned before. The apex point in the current path for positive holes preferably occurs at the same position as that in the current path for electrons and shifts from a symmetry axis a distance $\Delta$ compared to the case where the two gate regions are applied with the same potential. When the potential barriers for holes and electrons occur at the same position or in the vicinity, the two potential barrier functions $\Psi_n$ and $\Psi_p$ are further correlated to the represented by a single function $\Psi$.

Now, description will be made on more concrete embodiments.

As described before, it is preferable that a drift field for positive holes and a drift field for electrons substantially form a right angle in the vicinity of the potential barrier.

This leads to a configuration where two p-type regions face each other and two n-type regions face each other across a potential barrier region.

Two examples of such a configuration can be achieved utilizing a cylindrical coordinate system and an orthogonal coordinate system.

Figure 6A:
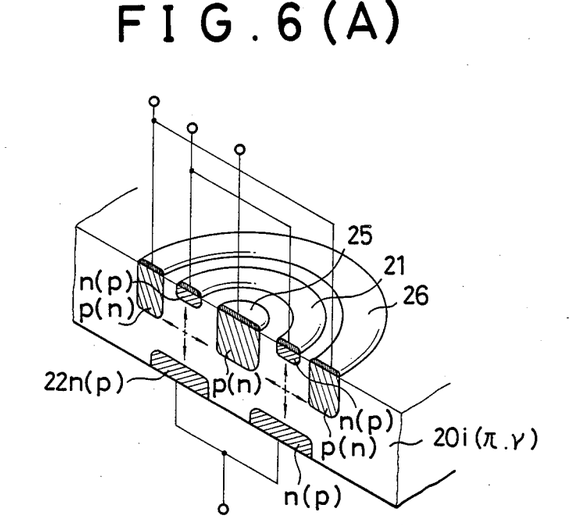
Figure 6B:
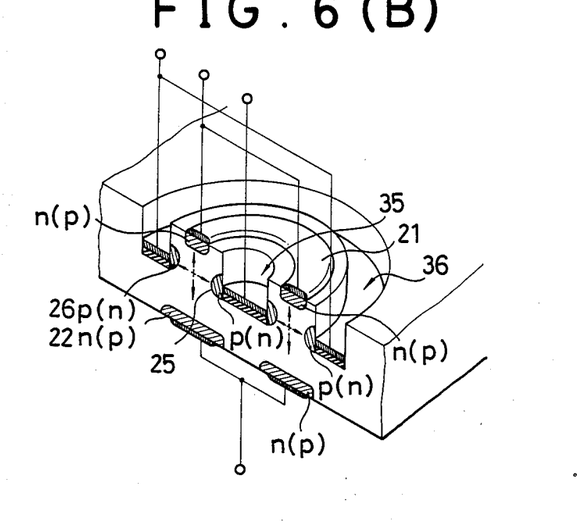

FIGS. 6A and 6B show embodiments utilizing the cylindrical coordinates.

In FIG. 6A, a pair of n-type ring-shaped regions 21 and 22 are formed in the opposed surfaces and face each other through a nearly intrinsic substrate region 20. In the upper surface, a central disc-shaped p-type region 25 and an outer ring-shaped p-type region 26 are formed concentrically with the ring-shaped n-type region 21. The p-type regions 25 and 26 are formed deeper than the n-type region 21. The p-type regions 25 and 26 are analogous to p-type gate regions and the n-type regions 21 and 22 are analogous to the source and the drain of an n-channel SIT.

For general knowledges of such a structure, see U.S. Pat. No. 4,284,997 which is hereby incorporated by reference.

In the structure of FIG. 6A, the p-type regions 25 and 26 should be deep so as to face each other through the nearly intrinsic channel region. However, the whole portions of the p-type regions 25 and 26 are not necessarily formed. It is only required that a pair of p-type regions face each other at a depth deeper than the n-type region 21.

FIG. 6B shows an embodiment having a structure similar to that of FIG. 6A but having a reduced mass of p-type regions. Namely, a central and an outer recessed portion 35 and 36 are formed deeper than the n-type region 21. A pair of ring-shaped p-type regions 25 and 26 are formed at a lower side wall portion of the central recess and a lower inner side wall portion of the outer groove 36. The bottom surface of the recessed portions 35 and 36 is covered with an insulating material. Electrodes are deposited on this insulator material and electrically contact the p-type regions 25 and 26. Also, other side wall portions than the contact area are covered with insulator layers.

The structure of FIG. 6B has a reduced parasitic capacitance for the p-type regions 25 and 26. Also, it is easier to eliminate parasitic diodes in the structure of FIG. 6B.

Figure 7A:
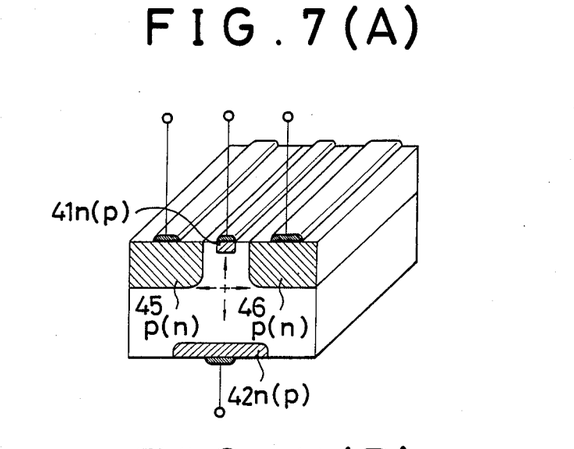
Figure 7B:
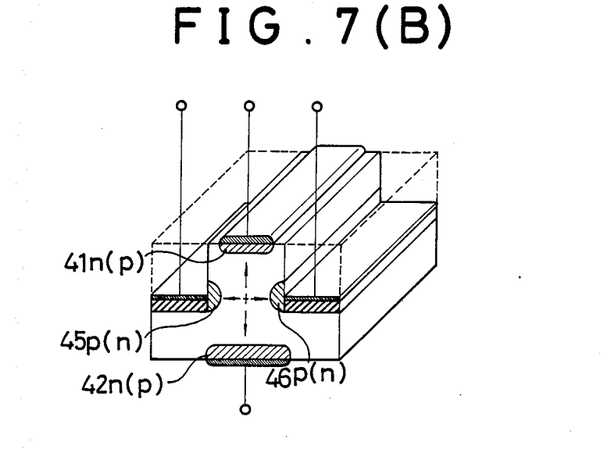

FIGS. 7A and 7B show embodiments utilizing the orthogonal Cartesian coordinate system. Two linear p-type regions 45 and 14 extend parallelly in the upper surface of a nearly intrinsic substrate. A linear n-type region 41 is formed between the p-type regions 45 and 46 and shallower than them. Another n-type region 42 is formed in the other surface to be registered to the n-type region 41.

Similar to the cases of FIGS. 6A and 6B, the whole portions of the deep p-type regions 45 and 46 are not necessarily required. FIG. 7B shows a structure where grooves are formed from the upper surface and the p-type regions 45 and 46 are formed only in the lower side wall portions to face each other. This structure has similar advantages of those of FIG. 6B.

It will be obvious to those skilled in the art that all of the conductivity types in the above embodiments can be reversed, with the polarities of the applied biases also reversed.

In the planar structure as in FIGS. 6A and 7A, deep pn-junctions are required for making it possible to establish a lateral drift field. In the cut-away structure as in FIGS. 6B and 7B, the surface itself extends deep and hence the pn-junction may not be formed deep and may be shallow.

In the circular structure of FIGS. 6A and 6B, the channel is looped to close by itself. In the linear structure of FIGS. 7A and 7B, it is necessary to limit the device in the longitudinal direction and to form the ends of the channel. This can be done by dielectric isolation.

The structures of FIGS. 6A and 6B are effectively usable in discrete devices and those of FIGS. 7A and 7B are effectively usable is integrated circuit devices.

Although symmetrical arrangements of electrodes are shown, they may not be necessarily provided.

Figure 8A:
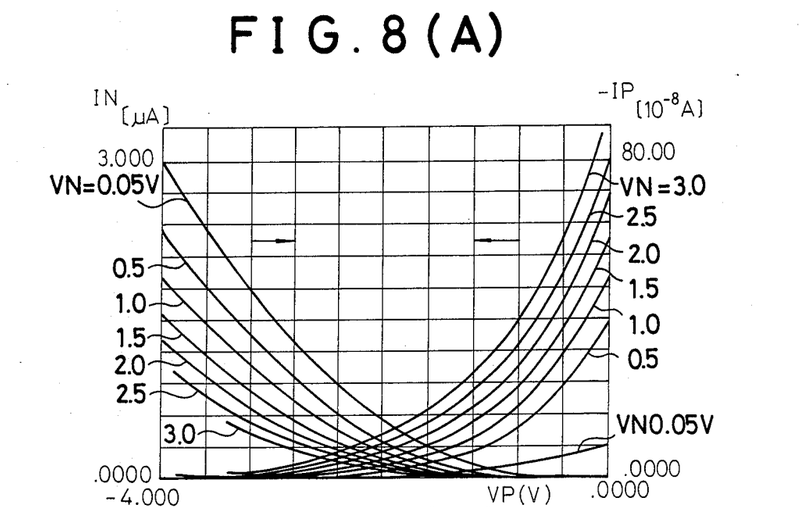
FIGS. 8A and 8B are graphs of current vs. Voltage (I-V) characteristics for a semiconductor device of FIG. 7A.
Figure 8B:
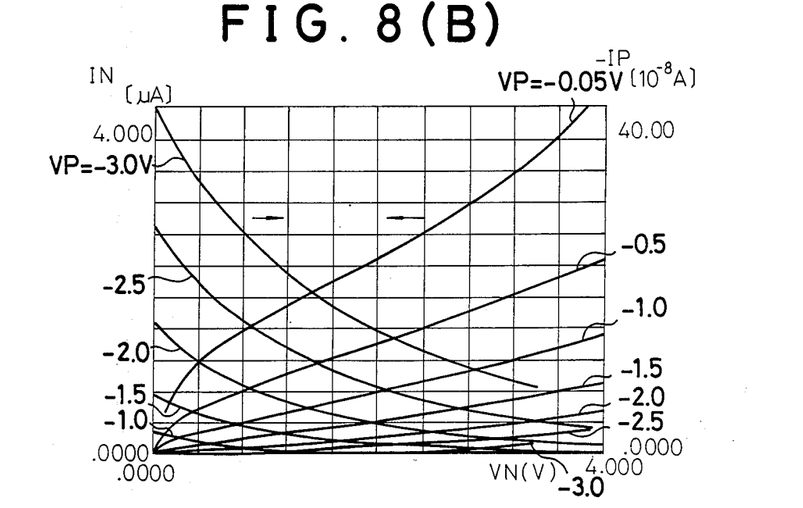

The current-voltage characteristics of the structure of FIG. 7A using a (111) silicon substrate and forming a longitudinal n-channel and a transverse p-channel with groove and insulator isolation are shown in FIGS. 8A and 8B. The active region is a $\nu$-type expitaxial layer of $N_D \neq 5 \times 10^{12}$ cm$^{-3}$. The operation mode is that of FIG. 5. Namely, one n-type region and one p-type region are grounded. The outer n-type region and the other p-type region are reversely biased. In FIGS. 8A and 8B, the abscissa represents the bias voltage of the p type region VP of the n type region VN, and the ordinate represents an electron current $I_n$ in the n-channel or a hole current $I_p$ in the p-channel.

It is observed that as a current of one channel increases, a current of the other channel decreases. The behaviors of these currents are represented by transfer functions f ($\Psi_n$) and g ($\Psi_n$).

As has been described above, the semiconductor device can have a small capacitance and a high transconductance. Thereby, the two current paths of the semiconductor device enable rapid operations.

Current flow diagram is three dimensional to enable effective utilization of the substrate volume. Thus, a high degree of integration with a high packing density is made possible.

Also, alternate switches can be formed in a single device structure. For example, an n-channel is conductive while a p-channel is pinched off at a moment, and then the n-channel is pinched off while the p-channel is conductive at another moment. Integration of digital logic circuits is facilitated by the complementary switches.

Also, when a correlation function h which correlates one transfer function f for one type of charge carriers and another transfer function g for the other type of charge carriers is established, analog information processing can be facilitated using the correlation function h.

I claim:

1. A semiconductor device having a main body region of a substantially intrinsic semiconductor two pairs of terminals defined by electrode regions, one of said pairs being of a p-type conductivity and the other pair being of an n-type, the built-in potentials of said terminals inducing a single potential barrier in said main body, whereby two controlled current paths are formed, each passing through said potential barrier and between a different one of said pairs of terminals, so that said two current paths comprise one electron path for allowing flow of a majority current formed of electrons and one hole path for allowing flow of a majority current formed of holes, the two paths being non-interacting, each current path having a current flow defined by a predetermined transfer function representing the relationship between current in the respective path and the height of said single potential barrier structure, said device being constructed so that said potential barrier height is controlled by input voltages applied to said pairs of terminals of the device.

2. A semiconductor device according to claim 1, wherein said two current paths are substantially orthogonal within a region of said device including said barrier.

3. A semiconductor device according to claim 1, wherein said device includes structural means for correlating the two transfer functions by a single function.

4. A semiconductor device according to claim 1, wherein said current paths occupy a three dimensional current distribution space.

5. A semiconductor device according to claim 1, wherein each of the current paths includes means for establishing a drift field, the drift fields of the two current paths being substantially orthogonal in the vicinity of the potential barrier.

* * * * *